(12) United States Patent
Nguyen

(10) Patent No.: US 11,435,652 B2
(45) Date of Patent: Sep. 6, 2022

(54) METALLIZED CAMERA WINDOWS

(71) Applicant: Sensors Unlimited, Inc., Princeton, NJ (US)

(72) Inventor: Thuc-Uyen Nguyen, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 375 days.

(21) Appl. No.: 16/356,735

(22) Filed: Mar. 18, 2019

(65) Prior Publication Data

US 2020/0301254 A1 Sep. 24, 2020

(51) Int. Cl.
*G03B 17/12* (2021.01)
*G02B 1/11* (2015.01)
*H01L 31/0203* (2014.01)
*H04N 5/225* (2006.01)
*H01L 27/146* (2006.01)

(52) U.S. Cl.
CPC .............. *G03B 17/12* (2013.01); *G02B 1/11* (2013.01); *H01L 27/14618* (2013.01); *H01L 31/0203* (2013.01); *H04N 5/2254* (2013.01); *H04N 5/22521* (2018.08)

(58) Field of Classification Search
None
See application file for complete search history.

(56) References Cited

U.S. PATENT DOCUMENTS

| | | | |
|---|---|---|---|
| 5,937,598 A | 8/1999 | Rain | |
| 6,661,084 B1* | 12/2003 | Peterson | H01L 25/16 257/680 |
| 2004/0188124 A1* | 9/2004 | Stark | H01L 21/50 174/535 |
| 2013/0286282 A1 | 10/2013 | Yamamoto | |
| 2014/0242291 A1* | 8/2014 | Joos | C03C 17/001 427/510 |
| 2015/0021330 A1* | 1/2015 | Ramesh | H05K 5/0095 220/377 |
| 2017/0110498 A1 | 4/2017 | Dale et al. | |
| 2018/0275484 A1* | 9/2018 | Wada | G02F 1/29 |

OTHER PUBLICATIONS

Extended European Search Report dated Jun. 22, 2020, issued during the prosecution of European Patent Application No. EP 19216021.6.

* cited by examiner

*Primary Examiner* — Derek S. Chapel
(74) *Attorney, Agent, or Firm* — Locke Lord LLP; Joshua L. Jones; Scott D. Wofsy

(57) ABSTRACT

An optical assembly includes a window having an interior surface and an opposed exterior surface. A perimeter surface connects between the interior surface and the exterior surface. A metal layer is bonded to the perimeter surface of the window. An anti-reflective coating (ARC) is bonded to the interior surface of the window. A metallic lid is joined to the metal layer for enclosing a focal plane array (FPA) aligned with the window.

4 Claims, 3 Drawing Sheets

METALLIZED CAMERA WINDOWS

BACKGROUND OF THE INVENTION

1. Field of the Invention

The present disclosure relates to optical systems, and more particularly to metallized camera windows.

2. Description of Related Art

Most focal plane arrays (FPAs), e.g., in digital cameras, are packaged behind a protective optical window. To provide a hermetic seal, metal layers are deposited around the edge of the window's back surface, i.e., the surface that faces toward the FPA receives a metal frame around its perimeter. This metal area is soldered onto a metal lid with a solder preform. For optimal transmission, a window needs an anti-reflective coating (ARC). The ARC and metal layers cannot fully overlap, so two masking steps are required in a tedious one-by-one alignment process. This alignment process is typically a manual process which limits handling time and yield.

The conventional techniques have been considered satisfactory for their intended purpose. However, there is an ever present need for improved metallized camera windows. This disclosure provides a solution for this need.

SUMMARY OF THE INVENTION

An optical assembly includes a window having an interior surface and an opposed exterior surface. A perimeter surface, including one or more side surfaces, connects between the interior surface and the exterior surface. A metal layer is bonded to the perimeter surface of the window. An anti-reflective coating (ARC) is bonded to the interior surface of the window. A metallic lid is joined to the metal layer for enclosing a focal plane array (FPA) aligned with the window.

The ARC can cover the interior surface of the window entirely. The ARC can cover a majority of the interior surface of the window, and the metal layer can extend onto an outer periphery of the interior surface of the window. The ARC can also be bonded to the exterior surface of the window. The ARC can cover the exterior surface of the window entirely. The ARC can cover a majority of the exterior surface of the window, and the metal layer can extend onto an outer periphery of the exterior surface of the window. The lid can form a portion of a package hermetically sealing an FPA therein. The perimeter surface of the window can define four rectangular surfaces bounding the window about its entire perimeter.

A method includes depositing metal on a perimeter surface of a window that connects between an interior surface of the window and an exterior surface of the window. The method includes joining the window to a lid by forming a solder joint between a metallic portion of the lid and the metal on the perimeter of surface of the window.

The method can include forming an anti-reflective coating (ARC) on the interior surface of the window. Forming an ARC on the interior surface can include depositing the ARC on the interior and exterior surfaces of the window in their entirety without masking.

Depositing metal can include depositing metal on a respective perimeter surface of each of a plurality of windows stacked together, which can include separating the windows from one another with lens paper or other protective material during deposition of the metal. The method can include forming an anti-reflective coating (ARC) on the interior surface of each of the windows as a batch. Forming a solder joint can include using at least one of a solder string and/or solder beads.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
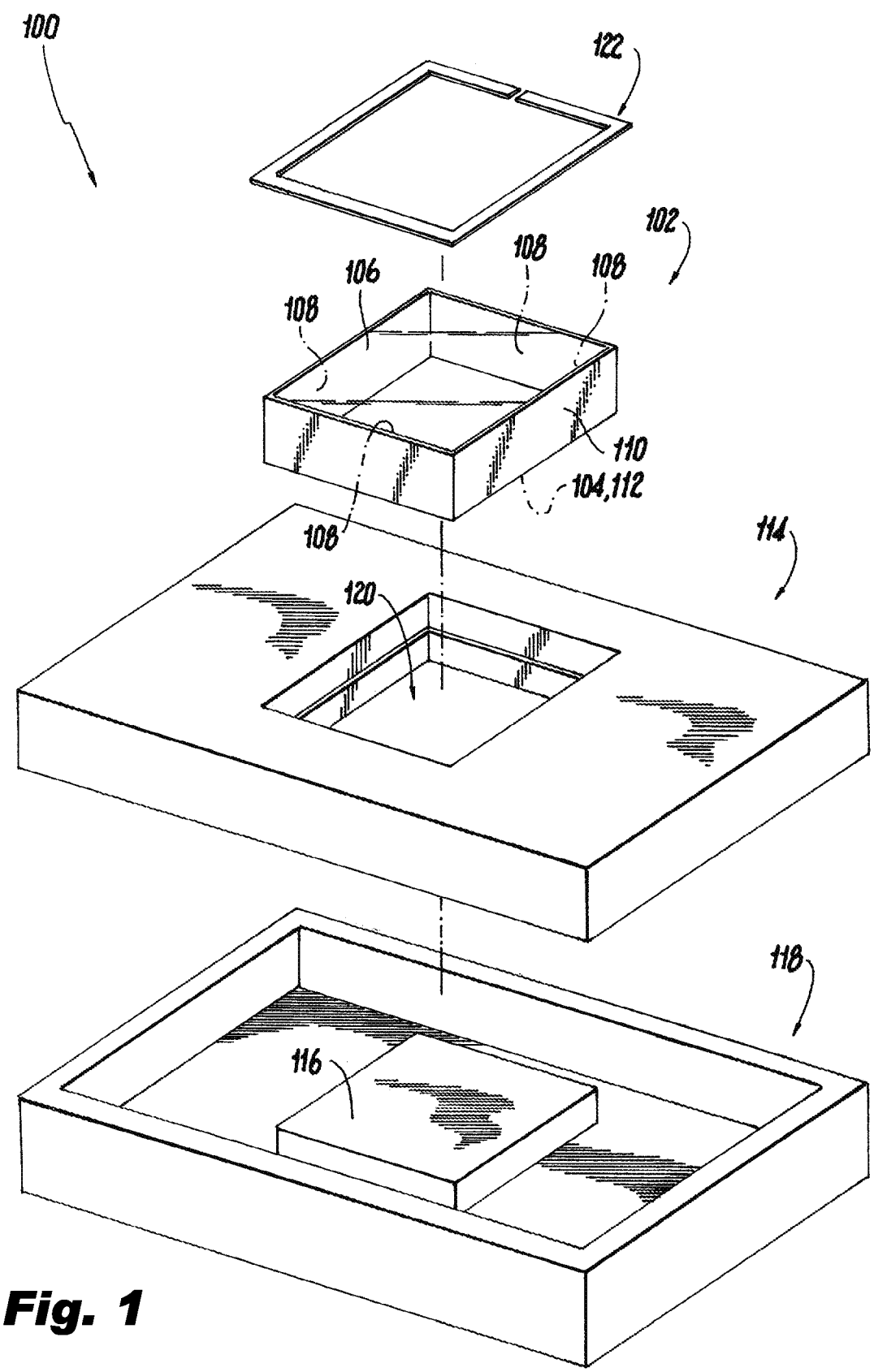
FIG. 1 is a schematic exploded perspective view of an exemplary embodiment of an optical assembly constructed in accordance with the present disclosure, showing the window, the lid, and the focal plane array (FPA) in a package.

Reference will now be made to the drawings wherein like reference numerals identify similar structural features or aspects of the subject disclosure. For purposes of explanation and illustration, and not limitation, a partial view of an exemplary embodiment of an optical assembly in accordance with the disclosure is shown in FIG. 1 and is designated generally by reference character 100. Other embodiments of optical assemblies in accordance with the disclosure, or aspects thereof, are provided in FIGS. 2-6, as will be described. The systems and methods described herein can be used facilitate joining windows to lids for imaging systems.

The optical assembly 100 includes a window 102 having an interior surface 104 and an opposed exterior surface 106. A perimeter surface 108, e.g., including all four rectangular surfaces bounding the window 102 about its entire periphery as labeled in FIG. 1, connects between the interior surface 104 and the exterior surface 106. A metal layer 110 is bonded to the perimeter surface 108 of the window 102.

Figure 4:
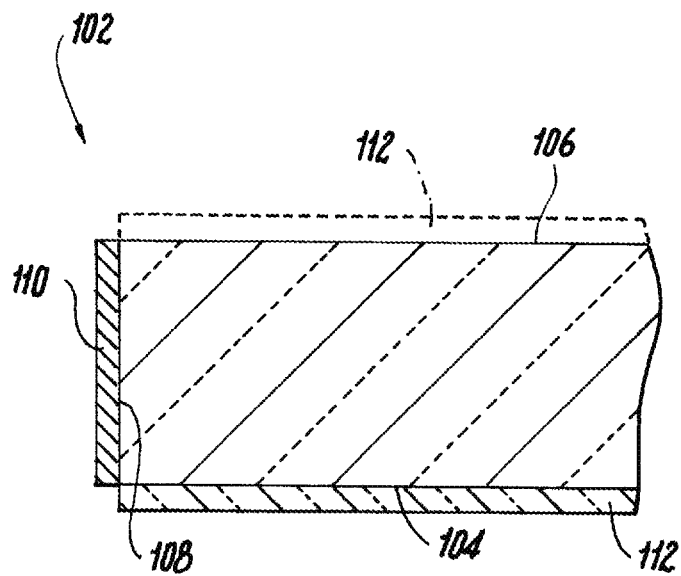
FIG. 4 is a schematic cross-sectional side elevation view of a portion of the window of FIG. 1, showing the ARC covering the entire interior surface of the window right up to the edge of the exterior surface 104.
Figure 5:
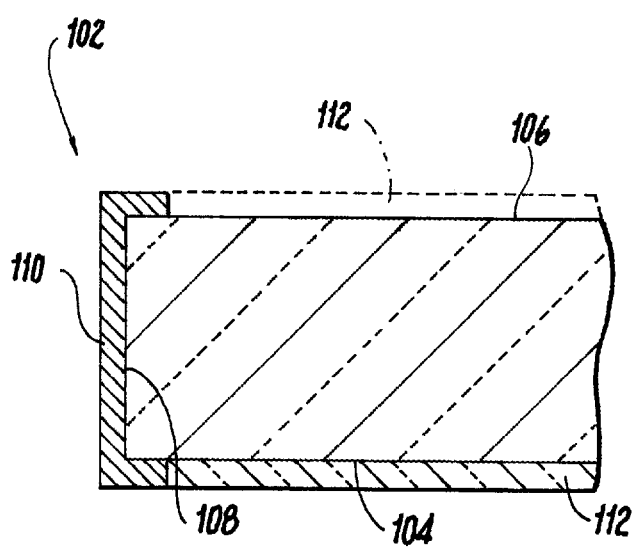
FIG. 5 is a schematic cross-sectional side elevation view of a portion of the window of FIG. 1, showing the metal layer overlapping the edge of the interior surface of the window.

An anti-reflective coating (ARC) 112 is bonded to the interior surface 104 of the window 102, as shown in FIG. 4. The ARC 112 can cover the interior surface 104 of the window 102 entirely, as in FIG. 4 where the ARC 112 is shown extending right to the edge of the window 102 bounded by the perimeter surface 108, so the ARC 112 can extend to all four edges of the interior surface 104. It is also contemplated that the ARC 112 can cover only a majority of the interior surface 104 of the window 102, as in FIG. 5, where the metal layer 110 extends onto an outer periphery of the interior surface 104 of the window 104 and the ARC 112 extends up to the metal layer 110. As schematically indicated in FIGS. 4 and 5 with broken lines, the ARC can also be bonded to the exterior surface 106 of the window 102 entirely (as in FIG. 4) or only mostly if the metal layer 110 extends onto the outer periphery of the exterior surface 106 of the window 110 (as in FIG. 5).

With reference again to FIG. 1, a metallic lid 114 is joined to the metal layer 110 for enclosing a focal plane array (FPA) 116 aligned with the window 102 for imaging. The lid 114 forms a portion of a package, when joined to backing 118, to hermetically seal the FPA 116 therein.

Figure 2:
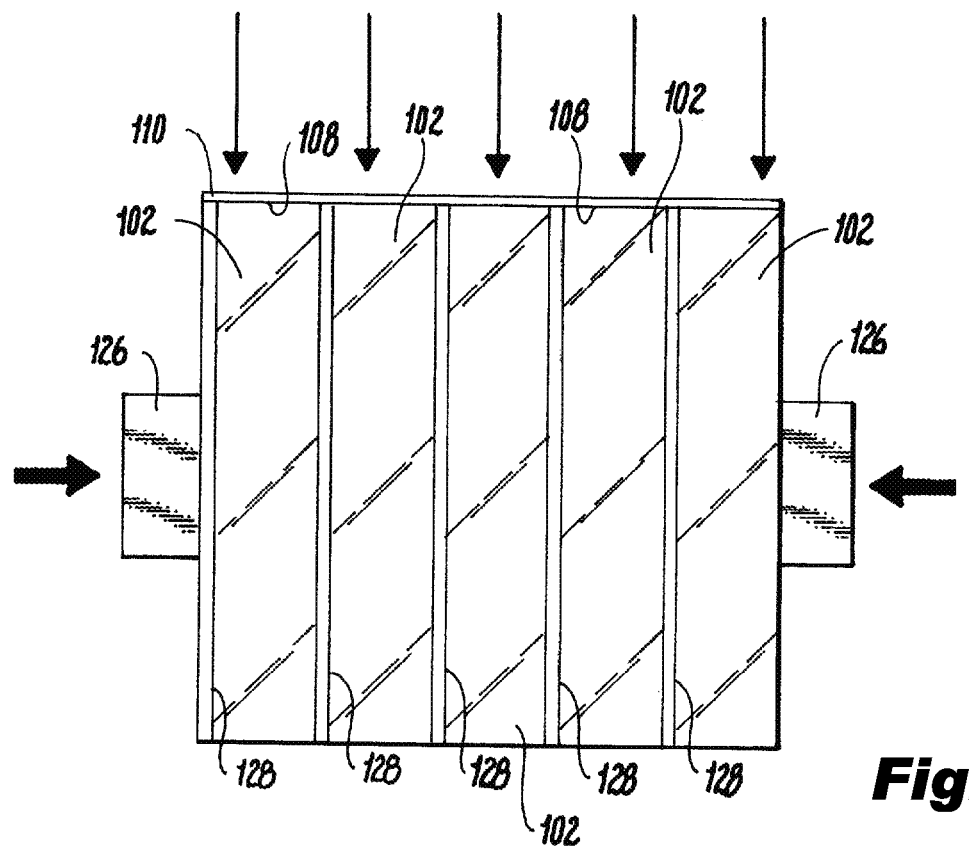
FIG. 2 is a schematic side elevation view of a plurality of windows as in FIG. 1, showing the windows during metal deposition.

With reference to FIG. 2, a plurality of windows 102 can be stacked together, e.g., pressed together by a clamp 126 as indicated by the large arrows in FIG. 2. The metal layer 110 can be then be deposited on a respective perimeter surface 108 of each of the windows 102 at one time as indicated by the parallel arrows in FIG. 2. The windows 102 can be separated from one another with lens paper 128 during deposition of the metal. Any other suitable protective material besides lens paper can be used, e.g. to protect the optical quality of the surfaces 104, 106. FIG. 2 shows metal being deposited on one of the four sides of the perimeter surface 108, however the process is repeated for all the sides until the complete metal layer 110 is formed on each of the windows 102.

Figure 3:
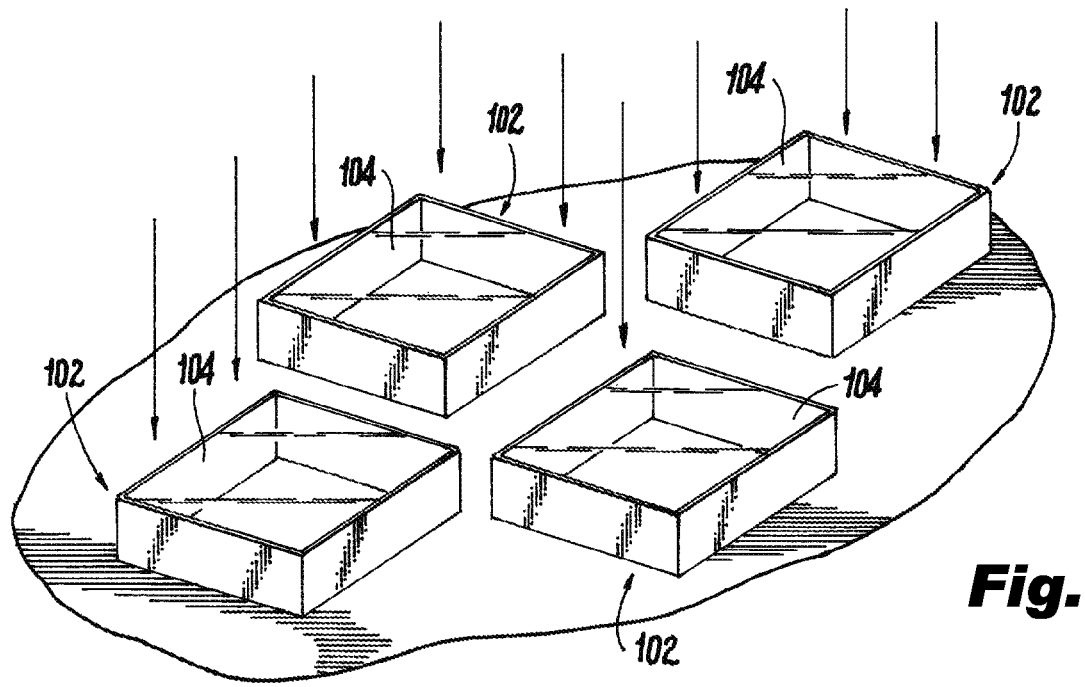
FIG. 3 is a schematic perspective view of the windows of FIG. 2, showing the windows being coated with an anti-reflective coating (ARC) after metal deposition.

With reference now to FIG. 3, after depositing the metal of the metal layer 110 on the perimeter surface 108 of the windows 102, each of the windows 102 with its metal layer 110 can be separated from the stack and the ARC 112 can be formed on the interior surfaces 104 of the windows as a batch, as indicated by the downward arrows in FIG. 3. The windows 102 can be flipped to repeat the ARC coating process for the exterior surfaces 106 (identified in FIG. 1). The ARC 112 can be deposited on the interior and exterior surfaces 104, 106 of each window 102 in their entirety without masking.

Figure 6:
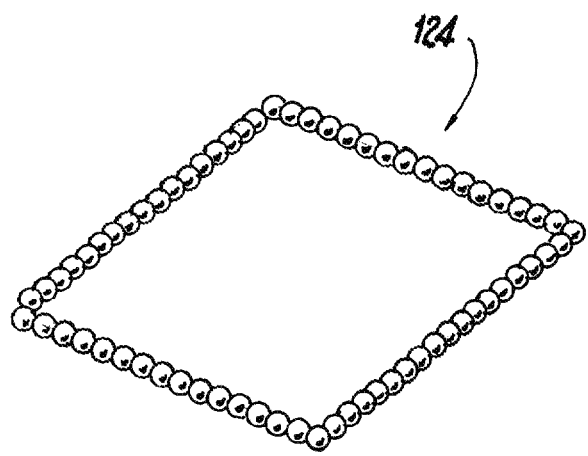
FIG. 6 is a schematic perspective view of a solder preform with solder beads for joining the window of FIG. 1 to the lid.

With reference again to FIG. 1, with the metal layer 110 and ARC 112 formed on each window 102, an individual window 102 can be joined to the lid 114 by forming a solder joint between a metallic portion 120 of the lid 114 and the metal of the metal layer 110 on the perimeter surface 108 of the window 102. For example, the entire lid 114 can be metallic, or at least the portion 120 identified in FIG. 1 can be metallic. Forming the solder joint can include using at least one of a solder string 122 as shown in FIG. 1 and/or solder beads 124 as shown in FIG. 6, which forms the solder joint between the outward facing surface of the metal layer 110 and the inward facing surface of the portion 120 of the lid 114. This can form a hermetic seal between the window 102 and the lid 114. The lid 114 can be joined in a way that hermetically seals the lid 114 to the backing 118 to form a completely hermetically sealed package around the FPA 116.

While it is possible to form the metal on the perimeter surface, followed by forming the ARC in the order described above, the order of these two processes can be reversed. For example, if it is found that the metal deposition process might damage ARC easily in a given application, one can do the metallization first, then form the ARC later after the pieces are washed. However in some applications, there may be reasons reverse that order.

The methods and systems of the present disclosure, as described above and shown in the drawings, provide for optical assemblies with superior properties including facilitated soldering of windows to lids for packaging focal plane arrays (FPAs). While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method comprising:
   depositing metal on a perimeter surface of a plurality of windows stacked together, wherein the perimeter surface of each window that connects between an interior surface of each the window and an opposed exterior surface of the each window, wherein the metal which covers the entire perimeter surface of the each window, but does not overlap the interior surface of each window or and the exterior surface of each window;
   separating each window from the stack;
   forming an anti-reflective coating (ARC) on the interior surface of the window and the exterior surface of the each window as a batch, wherein the ARC which covers the entire interior surface and the exterior surface of the each window, but does not overlap the metal layer on the perimeter surface of each window; and
   joining the each window to a lid by forming a solder joint between a metallic portion of the lid and the metal on the perimeter of surface of the each window.

2. The method as recited in claim 1, wherein forming the ARC includes depositing the ARC on the interior and exterior surfaces of the window in their entirety without masking.

3. The method as recited in claim 1, further comprising separating the windows from one another with lens paper or other protective material during deposition of the metal.

4. The method as recited in claim 1, wherein forming the solder joint includes using at least one of a solder string and/or solder beads.

* * * * *